United States Patent
Ratcliffe

(10) Patent No.: US 7,128,438 B2
(45) Date of Patent: Oct. 31, 2006

(54) LIGHT DISPLAY STRUCTURES

(75) Inventor: William R. Ratcliffe, Thousand Oaks, CA (US)

(73) Assignee: AgiLight, Inc., San Angelo, TX (US)

( * ) Notice: Subject to any disclaimer, the term of this patent is extended or adjusted under 35 U.S.C. 154(b) by 54 days.

(21) Appl. No.: 10/773,353

(22) Filed: Feb. 5, 2004

(65) Prior Publication Data

US 2005/0174770 A1    Aug. 11, 2005

(51) Int. Cl.
   *F21V 21/005* (2006.01)
(52) U.S. Cl. .............. 362/236; 362/237; 362/238; 362/243; 362/241
(58) Field of Classification Search .......... 362/235, 362/240–241, 237, 244–245, 249, 247, 238, 362/236, 243; 313/292, 238, 495–497; 200/310–317
   See application file for complete search history.

(56) References Cited

U.S. PATENT DOCUMENTS

| | | | | |
|---|---|---|---|---|
| 3,290,539 A * | 12/1966 | Lamorte | ............... | 313/114 |
| 4,935,665 A | 6/1990 | Murata | ............... | 313/500 |
| 4,990,971 A * | 2/1991 | Le Creff | ............... | 257/88 |
| 5,060,027 A * | 10/1991 | Hart et al. | ............... | 257/88 |
| 5,404,282 A * | 4/1995 | Klinke et al. | ............... | 362/249 |
| 5,490,048 A | 2/1996 | Brassier et al. | ............... | 362/238 |
| 5,534,718 A | 7/1996 | Chang | ............... | 257/98 |
| 5,664,667 A * | 9/1997 | Kenmochi | ............... | 200/314 |
| 5,836,676 A | 11/1998 | Ando et al. | ............... | 362/244 |
| 6,039,458 A * | 3/2000 | Coates et al. | ............... | 362/249 |
| 6,074,074 A | 6/2000 | Marcus | ............... | 362/240 |
| 6,318,886 B1 | 11/2001 | Stopa et al. | ............... | 362/555 |
| 6,331,063 B1 | 12/2001 | Kamada et al. | ............... | 362/237 |
| 6,345,903 B1 | 2/2002 | Koike et al. | ............... | 362/249 |
| 6,361,186 B1 * | 3/2002 | Slayden | ............... | 362/249 |
| 6,465,950 B1 * | 10/2002 | Baldi et al. | ............... | 313/497 |
| 6,476,551 B1 | 11/2002 | Osawa et al. | ............... | 313/506 |
| 6,561,690 B1 | 5/2003 | Balestriero et al. | ............... | 362/555 |
| 6,604,841 B1 * | 8/2003 | Liu | ............... | 362/249 |
| 6,609,813 B1 * | 8/2003 | Showers et al. | ............... | 362/240 |
| 6,614,103 B1 | 9/2003 | Durocher et al. | ............... | 257/678 |
| 6,770,960 B1 * | 8/2004 | Oohata | ............... | 257/678 |
| 6,796,681 B1 * | 9/2004 | Fan | ............... | 362/249 |
| 6,840,655 B1 * | 1/2005 | Shen | ............... | 362/249 |

\* cited by examiner

*Primary Examiner*—Renee Luebke
*Assistant Examiner*—Robert May
(74) *Attorney, Agent, or Firm*—Koppel, Patrick & Heybl

(57) ABSTRACT

Light display structures are provided that are simple and comprise few parts so that they can be economically fabricated from various polymers and quickly assembled. They are especially suited for carrying light-emitting elements and lend themselves for realization in a variety of forms such as elongate display structures and sheet-like display structures. They are based upon a plurality of light-emitting elements (e.g., light-emitting diodes) that are coupled between first and second conductors with the addition of other structures (e.g., spacers, wire bonds, tabs) that facilitate the energizing of the light-emitting elements.

25 Claims, 6 Drawing Sheets

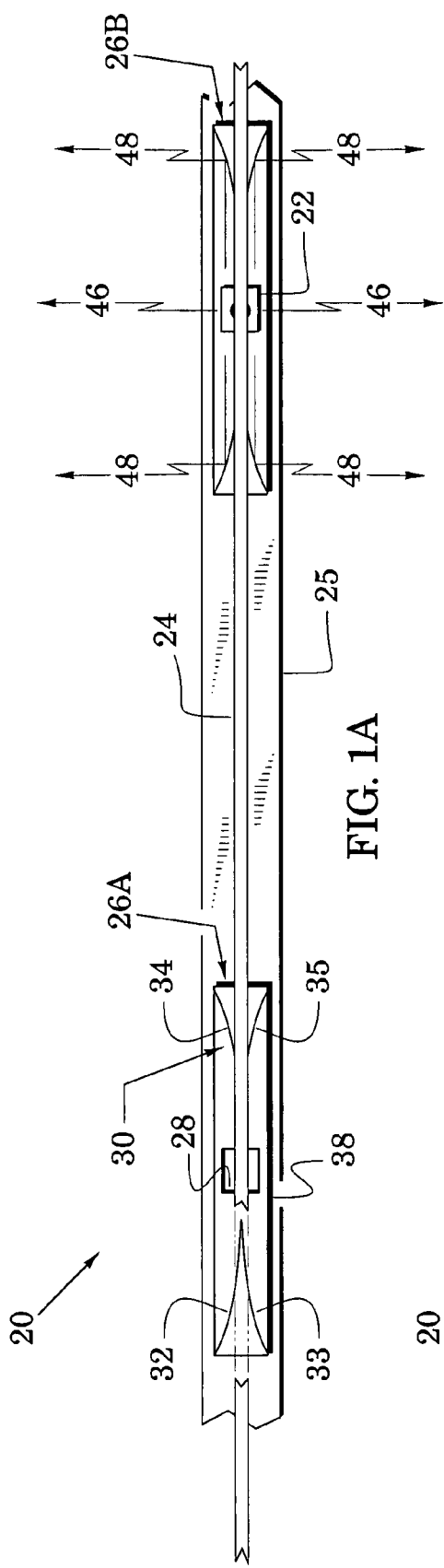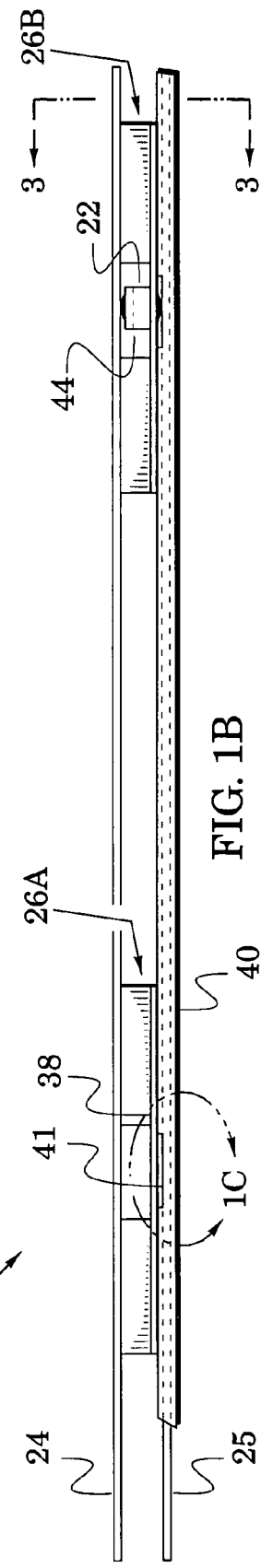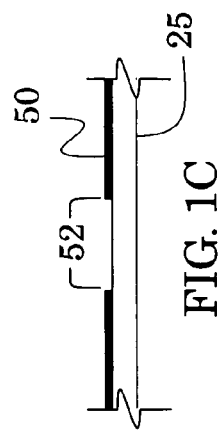

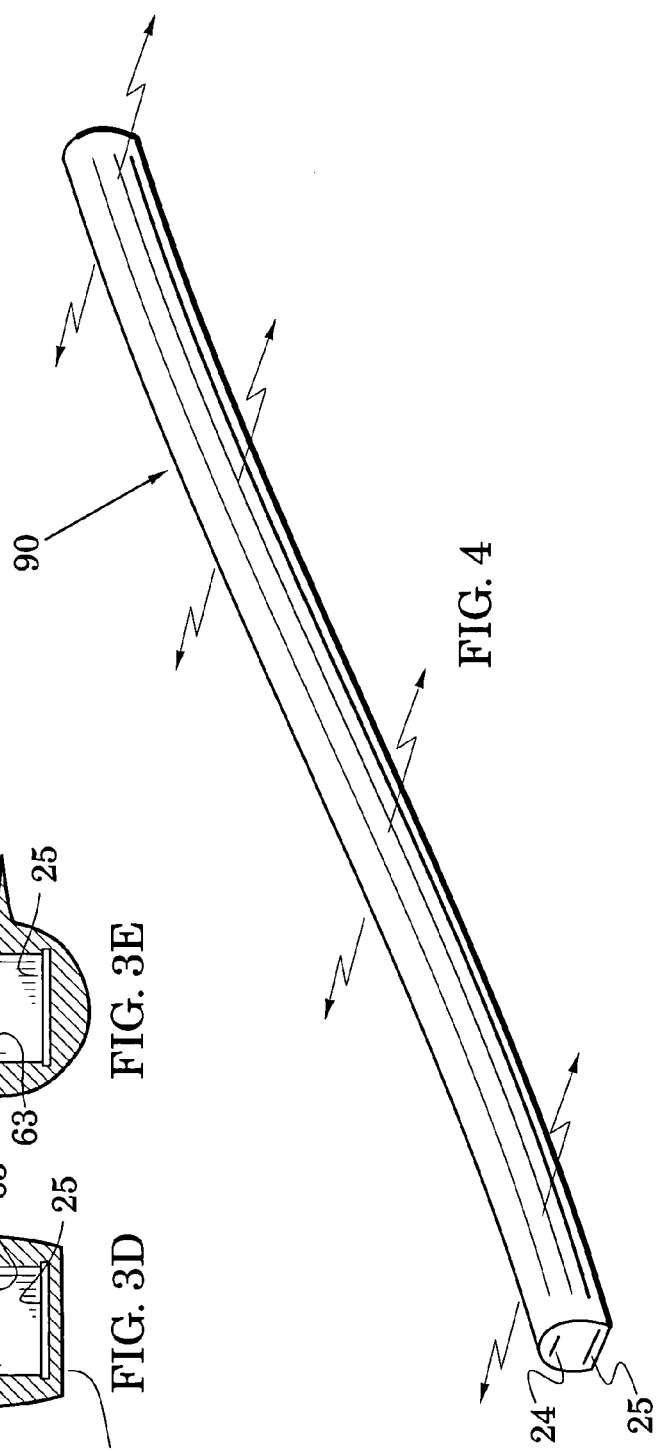

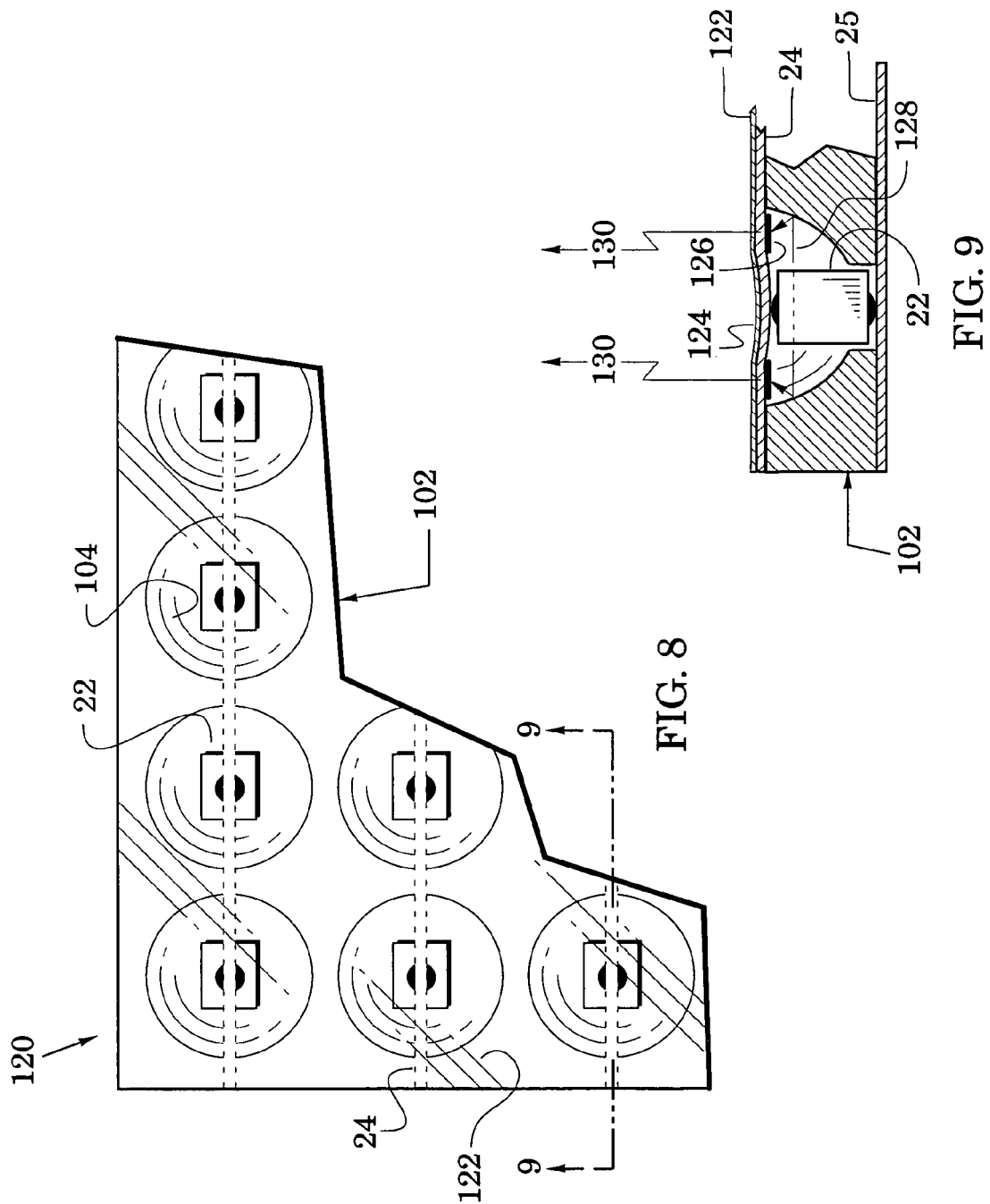

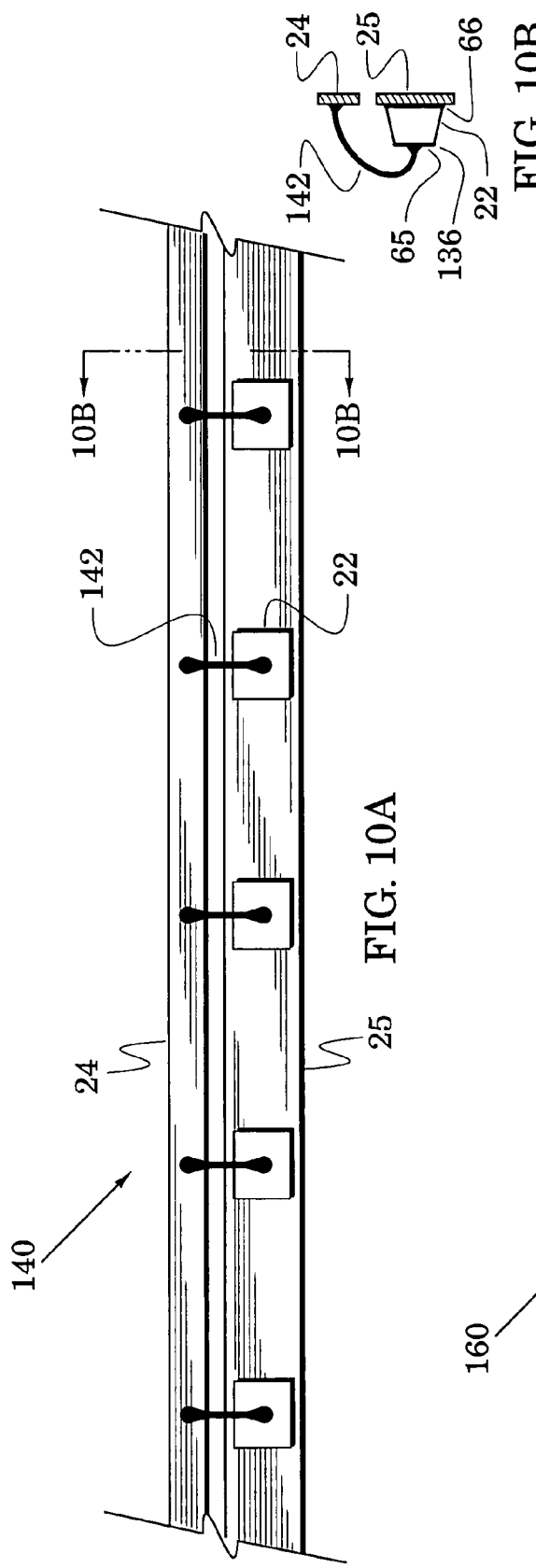

LIGHT DISPLAY STRUCTURES

BACKGROUND OF THE INVENTION

1. Field of the Invention

The present invention relates generally to light displays.

2. Description of the Related Art

A variety of light display structures have been provided in response to the advantageous features of light-emitting diodes (e.g., low voltage, low heating, low maintenance, color diversity and long life). These structures, however, have generally been complex and expensive to produce.

BRIEF SUMMARY OF THE INVENTION

Simple, inexpensive light display structures of the present invention are formed with various structures that facilitate the energizing of a plurality of light-emitting elements that are coupled between first and second conductors.

The novel features of the invention are set forth with particularity in the appended claims. The invention will be best understood from the following description when read in conjunction with the accompanying drawings.

BRIEF DESCRIPTION OF THE DRAWINGS

FIGS. 1A and 1B are top and side views of a light display structure embodiment of the present invention and FIG. 1C is an enlarged view of another embodiment for structure within the curved line 1C of FIG. 1B;

FIGS. 3A–3E are views along the plane 3—3 of FIG. 1B that illustrate additional light display structures;

FIG. 4 is an isometric view of the light display structure of FIG. 3C which emphasizes its flexible, elongate form;

FIGS. 5A and 5B are views of additional light display structures that can be carried on the structure of FIG. 4;

FIG. 8 is an enlarged view similar to FIG. 6B that illustrates additional light display structures;

FIG. 9 is an enlarged view along the plane 9—9 of FIG. 8 that illustrates additional light display structures;

FIG. 10A is a top view of another light display structure embodiment of the present invention;

FIG. 10B is a view along the plane 10B—10B of FIG. 10A;

FIG. 10C is a top view of another light display structure embodiment of the present invention; and FIG. 10D is a view along the plane 10D—10D of FIG. 10C.

DETAILED DESCRIPTION OF THE INVENTION

Figure 2:
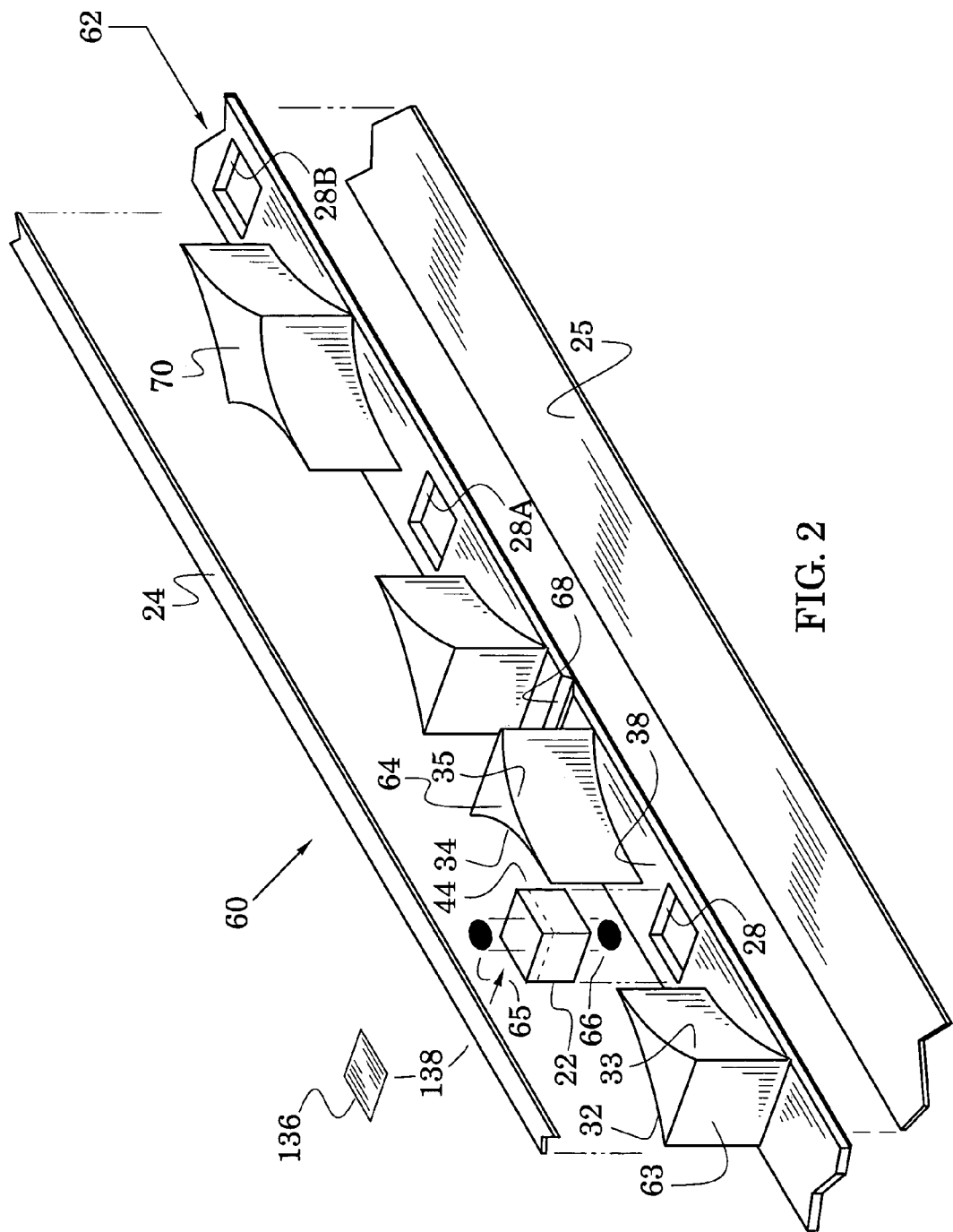
FIG. 2 is an enlarged isometric view of the light display structure of FIGS. 1A and 1B that illustrates additional light display structures.

FIGS. 1–10D illustrate light display structure embodiments that can be economically fabricated and quickly assembled to energize a plurality of light-emitting elements in a variety of light displays. In particular, FIGS. 1A and 1B illustrate a display structure embodiment 20 for energizing at least one light-emitting element 22. The structure includes first and second elongate conductors 24 and 25 and at least one spacer 26 that is positioned between the first and second conductors.

As indicated by a spacer 26A, the spacers each define an aperture 28 to receive the light-emitting element as it contacts the first and second conductors 24 and 25. The spacer 26A illustrates the aperture 28 while the spacer 26B illustrates reception of the light-emitting element 22 into the aperture. Each spacer 26 also defines at least one light redirector 30 that is positioned to redirect light away from its respective light-emitting element 22.

In particular, the light redirector may be configured in any of various forms (e.g., a reflective wall or a refractive wall) that will direct at least a portion of the light away from the spacer. For simplicity, the light redirector will subsequently be referred to as a wall which may be flat in one embodiment. In another embodiment, it preferably has a concave shape as shown in FIG. 1A. In another embodiment, the wall may have a substantially parabolic shape to enhance redirection of the light.

In the structure embodiment of FIGS. 1A and 1B, each spacer 26 defines first and second walls 32 and 33 that diverge with increasing distance from one side of their aperture 28 and third and fourth walls 34 and 35 that diverge with increasing distance from another side of their aperture 28. In one embodiment, the spacer may include a base 38 that defines the aperture 28 and the walls extend upward from the base.

As shown in FIG. 1B, the display structure may include a polymer (e.g., a thermoplastic or a thermosetting polymer) insulator 40 that encloses the second conductor 25. In this case, the insulator preferably defines an opening 41 positioned to facilitate contact between the light-emitting element and the second conductor 25. The spacers 22 are positioned to space the first and second conductors apart locally while the insulator 40 insures they do not contact elsewhere.

Although the light display structures of the invention may carry various light-emitting elements, the structure 20 of FIGS. 1A and 1B is especially suited to carry a light-emitting diode (LED) which is received in the aperture 28 with its cathode in contact with the second conductor 25 and its anode in contact with the first conductor 24.

In operation of the light display structure 20, a voltage is applied between the first and second conductors 24 and 25 which energizes the LED and causes light to be emitted from its light-emitting junction 44. As shown in FIG. 1A, the light radiates from the junction so that some light rays 46 issue directly away from the spacer 26B and other light rays 48 are redirected by the walls 32–34 to also radiate away from the spacer 26B.

As shown in FIG. 1C, another display structure may apply (e.g., by printing, transfer printing, silkscreening) an insulator 50 on the second conductor 25. The insulator is arranged (e.g., by masking or by ablating) to define a gap or aperture 52 into which the LED is received, i.e., the insulator 50 is configured to permit coupling of the LED to the second conductor.

The enlarged isometric view 60 of FIG. 2 supplements FIGS. 1A and 1B. It shows a strip 62 that facilitates fabrication of the spacers (26 in FIGS. 1A and 1B). The strip can be easily molded from a polymer and has a base 38 that defines apertures 28 and walls 30 that extend upward from the base. For example, the walls may include the first and second walls 32 and 33 that diverge with increasing distance from one side of their aperture 28 and the third and fourth walls 34 and 35 that diverge with increasing distance from another side of their aperture 28. Although not required, the diverging walls preferably abut at their ends that are proximate to their respective aperture. The walls terminate in a back wall 63 and a top wall 64.

A light-emitting element 22 in the form of an LED is shown in the process of being received into an aperture 28. Joining elements 65 and 66 are preferably formed of conductive materials (e.g., conductive epoxy, solder, reflow solder) and are provided to join the diode's anode to the first conductor 24 and the diode's cathode to the second conductor 25. This operation insures electrical continuity between the first and second conductors and their respective contacts of the LED. When a voltage is imposed between the conductors, the LED is energized and light is radiated from the diode's junction 44 and at least a portion of that light is redirected latterly away from the conductors 24 and 25 by the walls 30.

The strip 62 may be formed with a notch 68 that facilitates separation of one spacer from an adjoining spacer. As shown in FIG. 2, various other strip embodiments may be formed. For example, the spacer structure 70 defines two wall structures that face oppositely to be operative with apertures 28A and 28B. In an assembly process, spacers can be easily broken from the strip 62 (with aid, for example, from the notch 68) and spaced along the first and second conductors as shown in FIGS. 1A and 1B.

The first and second conductors 24 and 25 and their spacers 26 may be enclosed with various substantially-transparent structures to form elongate radiating elements. For example, FIG. 3A (a view along the plane 3—3 of FIG. 1B) shows them enclosed in a thermoplastic shrink tube 80 and FIG. 3B shows them enclosed by a thermoplastic molded cover 82 (the spacer's back wall 63 is indicated in each of these figures). In FIG. 3C, the cover 82 has been modified to a cover 84 that defines a mounting surface 85 that can abut, for example, a floor or wall.

In FIG. 3D, the cover 82 of FIG. 3B has been modified to a cover 86 that defines a pair of protrusions 87 in addition to defining the mounting surface 85 of FIG. 3C (the protrusions appear as outward-extending ribs when envisioned in the elongate structure 90 of FIG. 4 which is described below). Because of the flexible nature of these protrusions or ribs, they flex and absorb the pressure of an impinging object (e.g., a pedestrian's shoe) to thereby prevent damage to light-emitting elements within (as shown in FIG. 2).

In FIG. 3E, the cover 82 of FIG. 3B has been modified to a cover 88 that defines a mounting flange 89 which can facilitate attachment (e.g., with adhesive, with mechanical elements such as rivets or by sewing) to various objects (e.g., footwear, clothing apparel and architectural mountings).

Structures such as those of FIGS. 3A–3E can be used to form elongate light display structures such as the structure 90 of FIG. 4 which can be bent into various forms and which radiates light laterally when a voltage is placed across the first and second conductors 24 and 25.

Transparent or translucent decorative FIGS. 92 can be molded in various forms that slide onto (or snap over) the structure 90 as shown in FIG. 5A. Alternatively, a decorative FIG. 94 can include a hinged member 95 (a non-engaged position is shown in broken lines) which facilitates its installation over the structure 90 as shown in FIG. 5B.

Figure 6B:
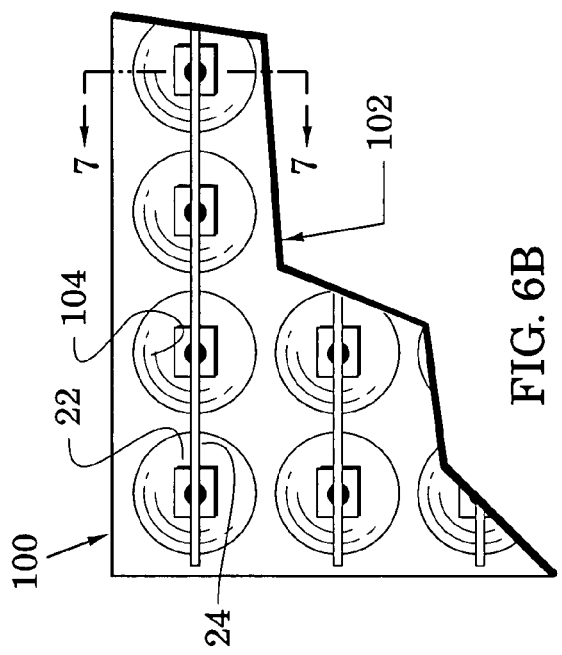
FIGS. 6A–6C are enlarged plan views of another light display structure embodiment of the present invention
Figure 6A:
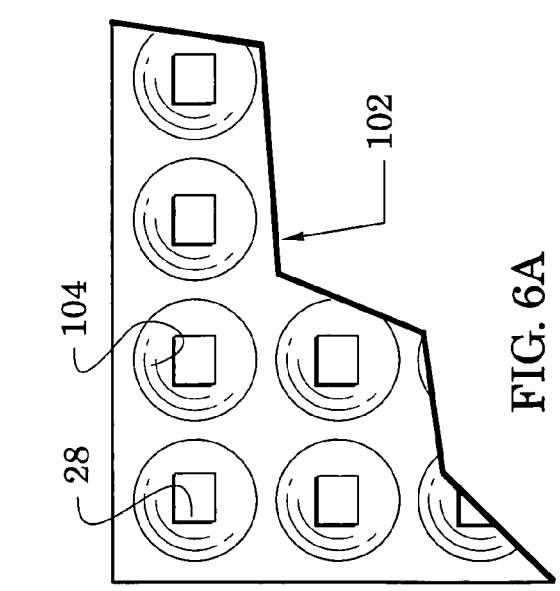
Figure 6C:
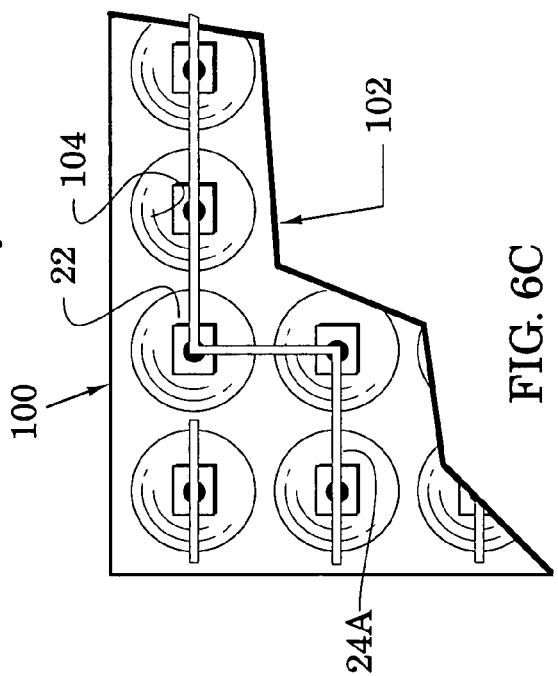

FIGS. 6A–6C illustrate another display structure embodiment 100 for carrying at least one light-emitting element 22. As shown particularly in FIG. 6A, a spacer 102 is shaped to define an array of apertures 22 and also to define an array of cup-shaped walls 104 that each surround a respective one of the apertures. FIG. 6B shows an array of light-emitting elements 22 that are each received in a respective one of the apertures. FIG. 6B also shows a plurality of first conductors 24 that each contact a first side of a selected group of the light-emitting elements 22. These conductors are also shown in FIG. 7A which is an enlarged view along the plane 7—7 of FIG. 6B.

Figure 7A:
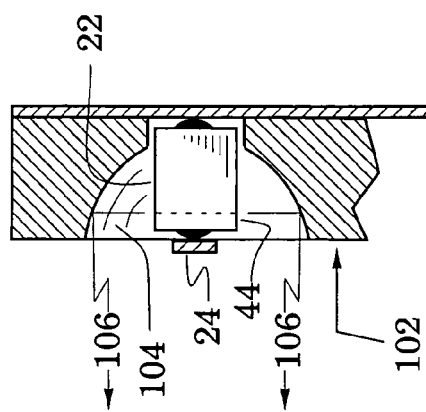
FIGS. 7A and 7B are enlarged views along the plane 7—7 of FIG. 6B that illustrate additional light display structures.

In particular, FIG. 7A shows the spacer 102 positioned to space the first and second conductors 24 and 25 with a light-emitting element received in an aperture to contact the first and second conductors. The second conductor 25 may comprise a plurality of elongate conductors (similar to the first conductors 24 in FIG. 6B) or may comprise a conductive sheet that contacts all of the light-emitting elements of FIG. 6B.

In one light display embodiment, the light-emitting elements are LEDs which radiate light from their light-emitting junctions 44. When a voltage is placed across the first and second conductors, the LEDs are energized and light rays 106 are radiated from the junction 44 and redirected laterally from the plane of the spacer 102 by the cup-shaped wall 104 as shown in FIG. 7A.

The first conductors 24 of FIG. 6B are shown to have a linear form but this is one of many possible embodiments. FIG. 6C, for example, shows a first elongate conductor 24A which is configured to contact various selected light-emitting elements that do not lie along a linear path. These elements can be selected so that the radiated light forms various figures (e.g., a letter, a number or a word) from the array of light-emitting elements.

Figure 7B:
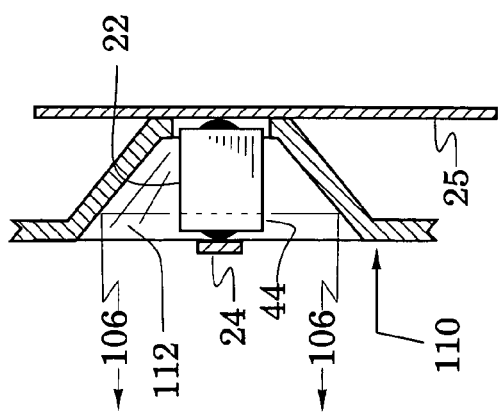

The cup-shaped wall 104 of FIG. 7A is shown to have a concave shape which may be substantially parabolic to enhance the redirected radiation. FIG. 7B is similar to FIG. 7A with like elements indicated by like reference numbers. Similar to the spacer 102 of FIG. 7A, a spacer 110 is positioned to space the first and second conductors and it defines an array of apertures to each receive a respective one of the light-emitting elements 22 as it contacts respective ones of the first and second conductors.

In contrast to the spacer 102, however, the spacer 110 defines a cup-shaped wall 112 that has a flat shape rather than the concave shape of the wall 104 of FIG. 7A. Also the spacer 110 spaces the first and second conductors apart without completely filling the space between these conductors. Instead, the spacer 110 comprises a sheet that is formed to define the cup-shaped wall 112 and to contact the second conductor 25 locally and contact the first conductor 24 in other regions.

FIG. 8 illustrates another light-emitting structure 120 which is similar to the structure 100 of FIG. 6B with like elements indicated by like reference numbers. The structure 120, however, includes a substantially-transparent sheet 122 formed of a suitable polymer (e.g., mylar). The first conductors 24 can be bonded to the sheet 122 and the sheet is then placed to bring these conductors into contact with their respective light-emitting elements 22.

As shown in FIG. 9 (a view along the plane 9—9 of FIG. 8), the sheet 122 and its first conductors 24 may be locally shaped to form dimples 124 that enhance contact between the conductors and their respective light-emitting elements 22. In another light-emitting structure embodiment, the the sheet 124 may carry photoluminescent films 126 (e.g., phosphor films, conjugated polymer, organic phosphor). In operation of this embodiment, light rays 128 from the light-emitting element 22 are redirected by the cup-shaped wall (104 in FIG. 8) to strike the phosphor films. In response to this excitation, the luminescent films emit light rays 130. Different luminescent films may be used to selectively display different colors.

Semiconductor LEDs have been configured to emit light with a variety of wavelengths and, generally, the forward voltage drop of these LEDs increases as the wavelength decreases. For example, red, yellow and green LEDs typically exhibit forward voltage drops in the respective ranges of 1.8–2.0 volts, 2.0–2.2 volts and 2.2–2.5 volts. In addition, each LED typically has a specified forward current that is recommended to enhance LED performance parameters (e.g., intensity, dissipation and lifetime).

Accordingly, it may be desirable to insert a resistive member between the LEDs of the light display structures and their associated first and second conductors. This is exemplified in FIG. 2 where a resistive member 136 (e.g., a resistive film such as a thin film resistor, a thick film resistor, conductive paste, conductive epoxy) is inserted between the anode of the LED 22 and the first conductor 24 (the insertion is indicated by insertion arrow 138—e.g., the member can be carried over the anode). Alternatively, the resistive member may be inserted between the cathode of the LED 22 and the second conductor 25.

The resistivity and cross section of the resistive member 136 are configured to realize a predetermined resistance which will provide the specified forward current when a selected supply voltage is applied via the first and second conductors 24 and 25. An exemplary green LED, for example, is specified to have a forward voltage drop of 2.8 volts and a forward current of 20 milliamps. For this particular LED, the resistivity and cross section of the resistive member 136 would preferably be configured to provide a resistance that increases through the range of 10 to 100 ohms when the selected supply voltage increases through the range of 3.0 to 4.8 volts.

In general, the resistivity and cross section of the resistive member 136 are chosen to realize the specified forward current in response to a provided supply voltage. To enhance conductivity between elements, conductive films may be carried on the anode and cathode surfaces and also inserted between the resistive member and its associated one of the first and second conductors.

FIGS. 10A-10D illustrate other light display embodiments of the present invention. In particular, FIG. 10A shows a light display embodiment 140 in which the first and second conductors 24 and 25 are arranged (e.g., side by side) to facilitate the insertion of wire bonds 142 that couple a selected one of the anode and cathode surfaces (wherein the anode surface has been selected in FIG. 10A) of LEDs 22 to the first conductor 24.

As shown in FIG. 10B, a resistive member 136 (introduced in FIG. 2) is preferably inserted between the LED 22 and the wire bond 142. In addition, the LED's anode and cathode (and the resistive member 136) may be joined to the wire bond 136 and the second conductor 25 with conductive elements 65 and 66 (also introduced in FIG. 2).

FIG. 10C illustrates a light display embodiment 160 that is similar to the embodiment 140 of FIG. 10A with like elements indicated by like reference numbers. In this embodiment, however, the first conductor 24 is modified to a conductor 164 which defines a plurality of tabs 166. Each of the LEDs 22 is then coupled between the second conductor 25 and a respective one of the tabs 166. FIG. 10D is similar to FIG. 10B except that the conductor 164 and its tab 166 is substituted for the first conductor 24 and the wire bond 142.

The light display embodiments of FIGS. 10A–10D may also be enclosed with various substantially-transparent structures to form elongate radiating elements. In FIGS. 3A–3D, for example, they can be substituted for the light display embodiments of FIGS. 1A–1C and 2 (which are represented in FIGS. 3A–3D by first and second conductors 24 and 25 and a spacer's back wall 63).

The light display structure embodiments shown in FIGS. 1–10D are simple and comprise few parts so that they can be economically fabricated from various polymers and quickly assembled. They lend themselves for realization in a variety of forms. For example, they can be realized in elongate display structures wherein light is directed laterally from the elongate shape or sheet-like display structures wherein light is directed laterally from the sheet. The descriptions of these embodiments include walls which are light redirectors that may be configured in various forms (e.g., reflective or refractive walls).

The spacers (e.g., 26, 102) shown in various ones of the figures, the insulator 40 of FIG. 1B, the tube 80 of FIG. 3A, the cover 82 of FIG. 3B and the transparent sheet 122 of FIGS. 8 and 9 can be fabricated from various insulators such as polymers (e.g., polyimide and mylar). The first and second conductors (24 and 25 in FIG. 2) may be formed from various conductive metal foils (e.g., copper and silver). The spacers may also be fabricated in colors that enhance the light redirected from their respective LEDs.

In an exemplary display embodiment, the photoluminescent films 126 of FIG. 9 may include conjugate polymers and organic phosphors that are excited, for example, by blue LEDs to thereby cause the redirected light rays 130 to be substantially white.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. A display structure for energizing at least one light-emitting element, comprising:
   first and second conductors; and
   a plurality of light-emitting elements coupled between said conductors;
   and further including at least one spacer positioned to space said first and second conductors apart wherein said spacer defines an aperture to receive a respective one of said light-emitting elements;
   wherein said spacer defines first and second light redirectors positioned to redirect light from the respective light-emitting element and that diverge with increasing distance from said aperture.

2. The structure of claim 1,
   wherein said light-emitting elements each have anode and cathode surfaces and further including a plurality of resistive members that are each carried over at least one of the anode and cathode surfaces of a respective one of said light-emitting elements.

3. The structure of claim 2, further including a polymer member that encloses said first and second conductors, said light-emitting elements and said resistive members.

4. The structure of claim 2, wherein said resistive members are resistive films.

5. The structure of claim 1, wherein said light redirectors have a concave shape.

6. The structure of claim 1, wherein said light redirectors have a substantially parabolic shape.

7. The structure of claim 1, wherein said light redirector has a cup shape.

8. The structure of claim 1, further including an insulator carried over one of said first and second conductors wherein said insulator defines a plurality of apertures that each receive a respective one of said light-emitting elements.

9. The structure of claim 1, further including an insulator carried on one of said first and second conductors and configured to permit coupling of said light-emitting elements to said first and second conductors.

10. A display structure for energizing at least one light-emitting element, comprising:
 first and second conductors; and
 a plurality of light-emitting elements coupled between said conductors;
 wherein said first conductor defines a plurality of tabs and each of said light-emitting elements is coupled between said second conductor and a respective one of said tabs;
 and further including an insulator carried over one of said first and second conductors wherein said insulator defines a plurality of apertures that each receive a respective one of said light-emitting elements.

11. The structure of claim 10, wherein said insulator is configured to permit coupling of said light-emitting elements to said first and second conductors.

12. The structure of claim 10, wherein said light-emitting elements each have anode and cathode surfaces and further including a plurality of resistive members that are each carried over at least one of the anode and cathode surfaces of a respective one of said light-emitting elements.

13. The structure of claim 12, wherein said resistive members are resistive films.

14. A display structure for energizing at least one light-emitting element, comprising:
 first and second conductors; and
 a plurality of light-emitting elements coupled between said conductors;
 and further including at least one spacer positioned to space said first and second conductors apart wherein said spacer defines an aperture to receive a respective one of said light-emitting elements;
 wherein said spacer defines a light redirector positioned to redirect light from the respective light-emitting element;
 and further including a phosphor film carried on said light redirector to enhance light radiated by said light-emitting elements.

15. The structure of claim 14, wherein said light-emitting elements each have anode and cathode surfaces, and further including a plurality of resistive members that are each carried over at least one of the anode and cathode surfaces of a respective one of said light-emitting elements.

16. The structure of claim 15, wherein said resistive members are resistive films.

17. The structure of claim 14, wherein said light redirector has a concave shape.

18. The structure of claim 14, wherein said light redirector has a substantially parabolic shape.

19. The structure of claim 14, wherein said light redirector has a cup shape.

20. The structure of claim 14, further including an insulator carried over one of said first and second conductors, wherein said insulator defines a plurality of apertures that each receive a respective one of said light-emitting elements.

21. The structure of claim 14, further including an insulator carried on one of said first and second conductors and configured to permit coupling of said light-emitting elements to said first and second conductors.

22. A display structure for energizing at least one light-emitting element, comprising:
 first and second conductors;
 a plurality of light-emitting elements coupled between said conductors; and
 at least one polymer spacer positioned to space said first and second conductors apart, wherein said spacer defines an array of cup-shaped light redirectors that are each positioned to redirect light from a respective light-emitting element.

23. A display structure for energizing at least one light-emitting element, comprising:
 first and second conductors;
 a plurality of light-emitting elements coupled between said conductors;
 at least one spacer positioned to space said first and second conductors apart wherein said spacer defines:
  a) an aperture to receive a respective one of said light-emitting elements; and
  b) a light redirector positioned to redirect light from the respective light-emitting element; and
 a phosphor film spaced from said light redirector to receive and enhance light redirected by said light redirector.

24. The structure of claim 23, wherein said light-emitting elements each have anode and cathode surfaces, and further including a plurality of resistive members that are each carried over at least one of the anode and cathode surfaces of a respective one of said light-emitting elements.

25. The structure of claim 24, wherein said resistive members are resistive films.

* * * * *